United States Patent
Stupak, Jr. et al.

(10) Patent No.: US 6,239,596 B1
(45) Date of Patent: *May 29, 2001

(54) TOTAL MAGNETIC FLUX MEASURING DEVICE

(76) Inventors: Joseph J. Stupak, Jr., 7102 SW. 10th Ave., Portland, OR (US) 97219; Todd R. Hoffman, 4735 NE. 92nd St., Portland, OR (US) 97220; Rian M. Callahan, 630 NE. 20th, Apt. #7, Portland, OR (US) 97232; Michael Stupak, 13083 SW. 154th Ave., Tigard, OR (US) 97223

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/871,397

(22) Filed: Jun. 9, 1997

(51) Int. Cl.[7] ................................................. G01R 33/02
(52) U.S. Cl. ............................................ 324/258; 324/260
(58) Field of Search ................................ 324/258–239, 324/244, 260–253, 254, 255, 256, 257, 234, 236; 33/355 R, 361

(56) References Cited

U.S. PATENT DOCUMENTS

| | | | |
|---|---|---|---|
| 3,568,052 | * 3/1971 | Anderson . | |
| 3,863,142 | 1/1975 | Werle | 324/258 |
| 3,893,104 | 7/1975 | Furukawa et al. | 340/347 |
| 3,903,610 | 9/1975 | Heaviside et al. | 324/254 |
| 4,229,697 | 10/1980 | Petrosky et al. | 324/244 |
| 4,276,324 | * 6/1981 | Pohler et al. | 324/212 |
| 4,303,886 | * 12/1981 | Rhodes | 324/255 |
| 4,672,359 | 6/1987 | Silver | 340/347 |
| 4,675,604 | * 6/1987 | Moyer et al. | 324/220 |
| 4,837,489 | 6/1989 | McFee | 324/67 |
| 4,845,434 | 7/1989 | Kuckes et al. | 324/346 |
| 4,851,775 | 7/1989 | Kim et al. | 324/247 |
| 4,929,897 | * 5/1990 | Van Der Walt | 324/240 |
| 4,940,983 | 7/1990 | Jones et al. | 341/171 |
| 4,947,118 | 8/1990 | Fujimaki | 324/248 |
| 4,977,402 | 12/1990 | Ko | 341/133 |
| 5,027,069 | 6/1991 | Roehrlein | 324/248 |
| 5,045,788 | 9/1991 | Hayashi et al. | 324/248 |
| 5,093,618 | 3/1992 | Goto et al. | 324/248 |
| 5,113,136 | 5/1992 | Hayashi et al. | 324/247 |
| 5,152,288 | 10/1992 | Hoenig et al. | 128/653 |
| 5,182,514 | 1/1993 | Rice, Jr. | 324/244 |
| 5,239,264 | 8/1993 | Hawks | 324/253 |
| 5,248,941 | 9/1993 | Lee et al. | 324/248 |
| 5,287,058 | 2/1994 | Goto et al. | 324/248 |
| 5,351,554 | 10/1994 | Budmiger | 73/861.17 |
| 5,455,511 | 10/1995 | Duret | 324/301 |
| 5,457,383 | 10/1995 | Takahashi | 324/247 |
| 5,467,015 | 11/1995 | Gotoh | 324/248 |
| 5,469,057 | 11/1995 | Robinson | 324/248 |
| 5,506,500 | 4/1996 | Krause et al. | 324/201 |
| 5,652,512 | * 7/1997 | Feintuch et al. | 324/254 |
| 5,764,052 | * 6/1998 | Renger | 324/258 |

OTHER PUBLICATIONS

E.G. DeMott, "Integrating fluxmeter with Digital Readout," IEEE Transactions on Magnetics, pp. 1, Jun. 1970.*

H. Sasaki, "A Simple Precision Fluxmeter".

Nuclear Instruments and Methods 76, 1969, pp. 100–102.

* cited by examiner

*Primary Examiner*—Jay Patidar

(57) ABSTRACT

A magnetic flux measuring device includes a coil of conductive material for sensing magnetic flux and producing a voltage in the presence of a changing magnetic field. An analog to digital converter is coupled to an output of the sensing coil for sampling the voltage produced by the magnetic flux sensing coil and for converting that voltage to digital data. A digital integrating device determines the total magnetic flux sensed by the coil over an event time interval by integrating the digital data over that same time interval.

12 Claims, 5 Drawing Sheets

TOTAL MAGNETIC FLUX MEASURING DEVICE

BACKGROUND OF THE INVENTION

The following invention relates to a fluxmeter and more particularly to a fluxmeter having digital circuitry to provide a high degree of stability and accuracy.

Fluxmeters are devices which measure total magnetic flux linking a sensor coil. The fluxmeter measures total flux, which is the integral of flux density times area over the area of the coil. The output of the fluxmeter is proportional to the number of turns on the coil as well. Typically, a fluxmeter uses a coil of electrically conductive wire which is often chosen by the user for the particular purpose at hand.

For a coil circling a flux path, the Faraday Induction Law states that:

$$E = n d\phi/dt.$$

Therefore, the total flux ($\phi$) is proportional to the integral of the voltage over time and inversely proportional to the number of turns in the coil:

$$\phi = 1/n \int E dt + \phi_0.$$

In conventional fluxmeters the meter is set to zero before the measurement is made so that $\phi_0=0$. The output may also include a multiplier correction for the number of turns in the coil or scale changes for the output display.

Conventional fluxmeters are analog devices and typically employ an operational amplifier with a shunt capacitor to integrate the voltage over time. Two different problems are encountered with this type of device. The first is that the input impedance of the meter varies with the output scale setting. If the input impedance is low enough, and if the sensor coil has significant resistance, a correction is required which must be computed and which is different for each output scale setting. Additionally, analog integrators are highly susceptible to drift. Any small offset voltage produces a gradual change in the output, even with no actual change in flux. The offset voltage may arise as a result of electrical and magnetic noise. The drift may be so large, however, that it may be difficult or impossible to obtain accurate, reliable and repeatable readings.

A typical fluxmeter is shown in a paper by Sasaki "A Simple Precision Fluxmeter", Nuclear Instruments and Methods 76, North Holland Publishing Company (1969) pp. 100–102. The Sasaki fluxmeter states that it employs an integrating digital voltmeter, but in reality Sasaki's integrator is a conventional analog integrator with digital processing of the integrated output. This device is therefore susceptible to the type of drift discussed above. Another type of fluxmeter is shown in the U.S. Patent to Krause, U.S. Pat. No. 5,506,500. Krause appears to show the use of a digital voltmeter as a fluxmeter, however, the voltmeter is not truly a digital device, but instead contains a precision analog integrator comprising an OP amp and capacitor. It is therefor susceptible to the problem of drift as outlined above. Furthermore, Krause relies upon a stepper motor to move a sample between a coil pair. The mechanical dimensions of the device are carefully controlled as are the starting and stopping of the motor which controls the timing of a measurable event. With manually operated fluxmeters however, there is no such degree of control, and events of interest must be determined by the instrument itself which must discriminate frequently between the measurement of magnetic flux and readings caused by noise, such as noise from nearby AC-lines, fluorescent lighting or machinery.

SUMMARY OF THE INVENTION

A magnetic flux measuring device constructed according to the invention includes a coil of conductive material for sensing magnetic flux and producing a voltage in the presence of a changing magnetic field. An analog to digital converter is coupled to an output of the sensing coil for sampling the voltage produced by the magnetic flux sensing coil and for converting that voltage to digital data. A digital integrating device determines the total magnetic flux sensed by the coil over an event time interval by integrating the digital data over that same time interval.

Digitizing the output of the coil and integrating the data digitally makes the instrument much less susceptible to the common drift experienced by analog type integrating devices. It also permits the filtering and correction of the data prior to integration, and allows for more accurate discrimination between noise and events of interest.

The analog to digital converter may be coupled to a recirculating memory which continuously refreshes data, writing over the oldest stored data. Connected in parallel to the recirculating memory is an event detector. The event detector is coupled to a noise detector which averages the steady-state output of the analog to digital converter in the environment of use, but away from the sample to be tested. The noise detector calculates an average ambient noise level. The event detector compares the average ambient noise level with the output of the analog to digital converter and when the output rises above the noise threshold for a predetermined period of time, an event is detected. The detection of an event triggers a counter which captures the data in the recirculating memory from a time just prior to the detection of an event until the event has stopped. The memory addresses thus detected are downloaded and the digital data is sent to an event analyzer. The event analyzer contains filtering, offset correction and a digital integrator.

Because an event may last longer than the dynamic space available in the recirculating memory, the counter may include a rate control which slows down the sampling rate of the analog to digital converter. Thus, data from a predetermined time before event start is not overwritten in the memory. This provides for less resolution in the event data, but this is an acceptable trade-off given the fact that the event data at this point is well above the noise threshold.

The user may provide input to the event analyzer which includes selective filtering, optimization based upon a previous event, output scale factoring or change of units and selections based upon the physical coil configuration such as scaling for the number of turns in the coil. The event analyser also includes a digital integrator. The digital integrator calculates flux by multiplying each digital voltage sample by the time interval over which the sample was taken and summing the products over a well defined period.

This approach results in a very high fixed input impedance which does not require that drift and the effects of noise be removed completely. Having the information in digital form allows for easy transmittal to other instruments, computers, printing or storage. Filtering techniques and noise correction methods may be updated by changes in software and do not require any new circuitry to implement.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
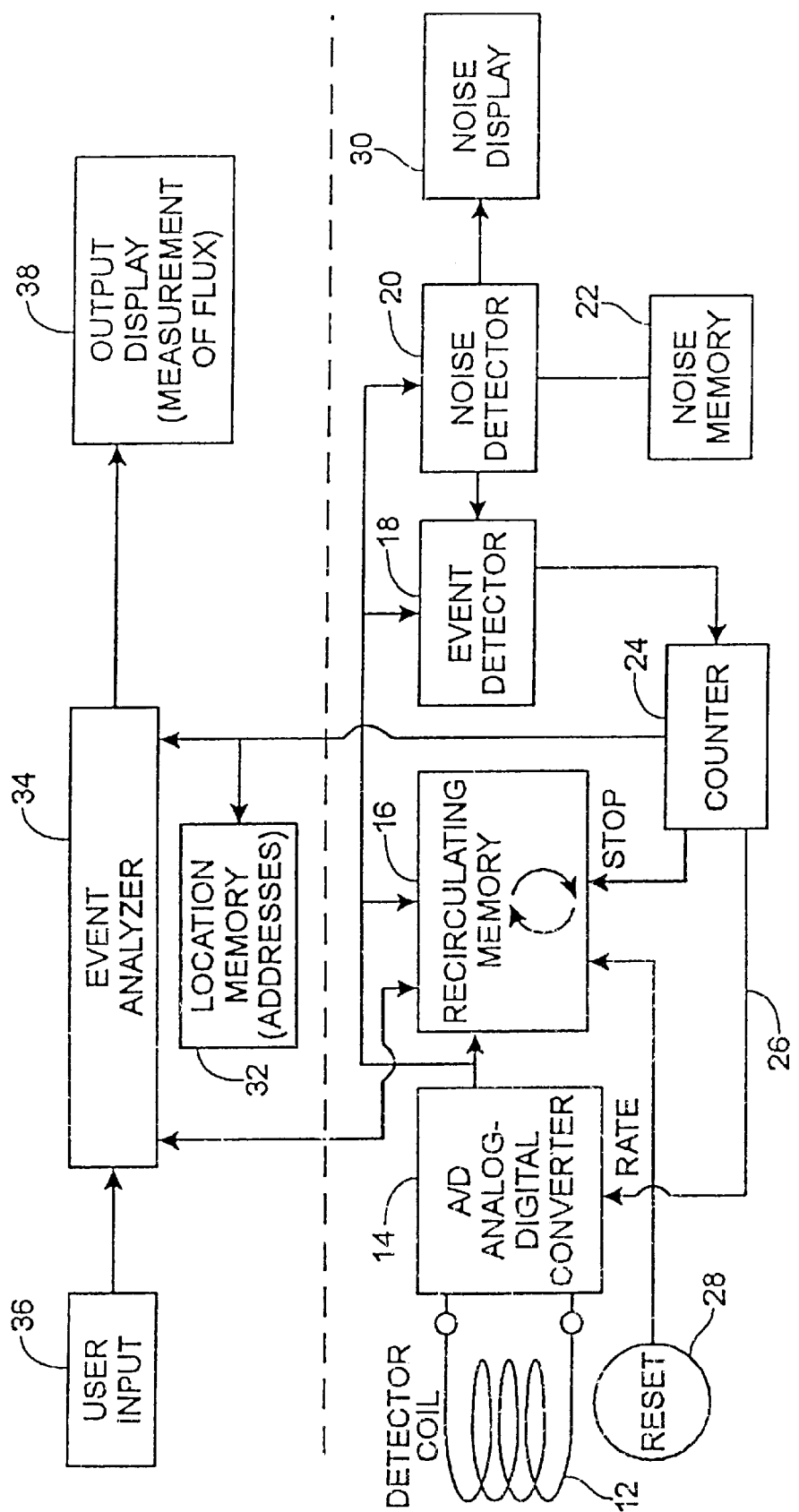
FIG. 1 is a block schematic drawing of a magnetic flux detecting device.

Referring to FIG. 1 a flux measuring device includes a detector coil 12 which is coupled to an analog to digital converter 14. The analog to digital converter 14 has an output that is coupled to a recirculating memory 16, an event detector 18 and a noise detector 20. The noise detector 20 includes a noise memory 22. The event detector is coupled to a counter 24 which has an output connected to the recirculating memory and a rate control output 26 coupled to the analog to digital converter 14. A reset switch 28 is also coupled to the recirculating memory 16 which clears the memory when pressed. The noise detector 20 includes a noise display unit 30. The output of the counter 24 is coupled to a location memory 32 and to an event analyzer 34. The event analyzer 34 is also coupled to the recirculating memory 16. A user input unit 36 having various programmable functions and user options is coupled to the event analyzer 34. The output of the event analyzer 34 is connected to an output display unit 38 which may be any type of visual display, such as an LCD device.

The signal from the detector coil is sampled by the ADC 14 at a nominal or predetermined rate and converted to digital data. The data is stored in the recirculating memory 16 so that the freshest data overwrites the oldest data previously stored in the memory. The output of the ADC 14 is also provided to the event detector 18 and to the noise detector 20, whose functions will be described below.

Because of the high amount of noise inherent in the environment in which the system is typically used (e.g., AC line noise, fluorescent lighting, inductive loads) it is necessary to discriminate between ambient noise and the detection of a genuine event of interest. An event is detected when the signal from the detector coil 12 raises significantly above the background noise level and remains there for a predetermined amount of time. Once this occurs, the counter 24 is started, which preserves data collected in the recirculating memory 16 from a time before the event started until after the stopping point of the event. Thus, the counter 24 prevents memory from being overwritten from a time prior to the start of an event. If the counter determines that the memory 16 is half full with information which may not be overwritten and, if the event detector 18 reports that the event is still continuing, then the counter 24 signals the ADC 14 on line 26 to sample at a lower rate, albeit at reduced resolution, so that the entire event may be preserved. The sampling could be lowered still more if the event continues as the remaining available memory is reduced again by half or by some other fixed ratio.

The address location of the event start, which will usually be later than the recorded event's starting address as determined by the counter 24, the event stop detection of zero crossing (below the noise threshold) the signal start location and the memory locations at which the rate changes occurred are kept in the location memory 32. At some fixed time after the event detector 18 signals that the event is complete, the counter 24 stops the recirculating memory 16 and this data is provided to the event analyzer 34 for filtering, offset correction, and integration.

At this point in the cycle the data in the event analyzer 34 is data which has not been filtered or corrected, but is simply raw data as picked up by the detector coil 12. The user input 36 may provide any number of options for data correction and filtering. Options include filters that compensate for 60 cycle noise. This also includes multiples of the 60 cycle per second line frequency common in electrical wiring. A high frequency cut-off filter filters noise which may be caused by fluorescent lighting.

The event analyzer 34 includes an integrator 40, a 60 cycle filter 42 which controls the time interval of the integrator 40 in accordance with the description below, a DC offset correction 44, and a low pass filter 46. The 60 cycle filter 42 and the DC offset 44 are coupled to the location memory 32 and the counter 24. The low pass filter 46 is coupled to the recirculating memory 16 and to the user input 36.

Noise that occurs at 60 cycles and at multiples of 60 cycles may be filtered by extending the time event interval over which integration takes place in the integrator 40 so that the event interval is an integral multiple of the 60 cycle period. Since 60 cycle noise is caused by AC lines (which may also include three phase lines), the noise is symmetrical about the zero crossing point. Integration, therefore, reduces the noise to zero as long as the integration takes place over the proper event interval. The 60 cycle filter 42 therefore extends the integration time interval so that it equals the next integral multiple of the period at 60 hz.

The low pass filter may include any conventional digital filter that rejects high frequency noise. Such digital filters are well known in the art.

The DC offset correction circuit 44 calculates a DC offset by averaging the ambient signal present from a time prior to the detection of an event. This data is kept in the noise memory 22. A predetermined number of data points prior to the event are averaged and this average represents an offset to the recovered data.

Figure 3A:
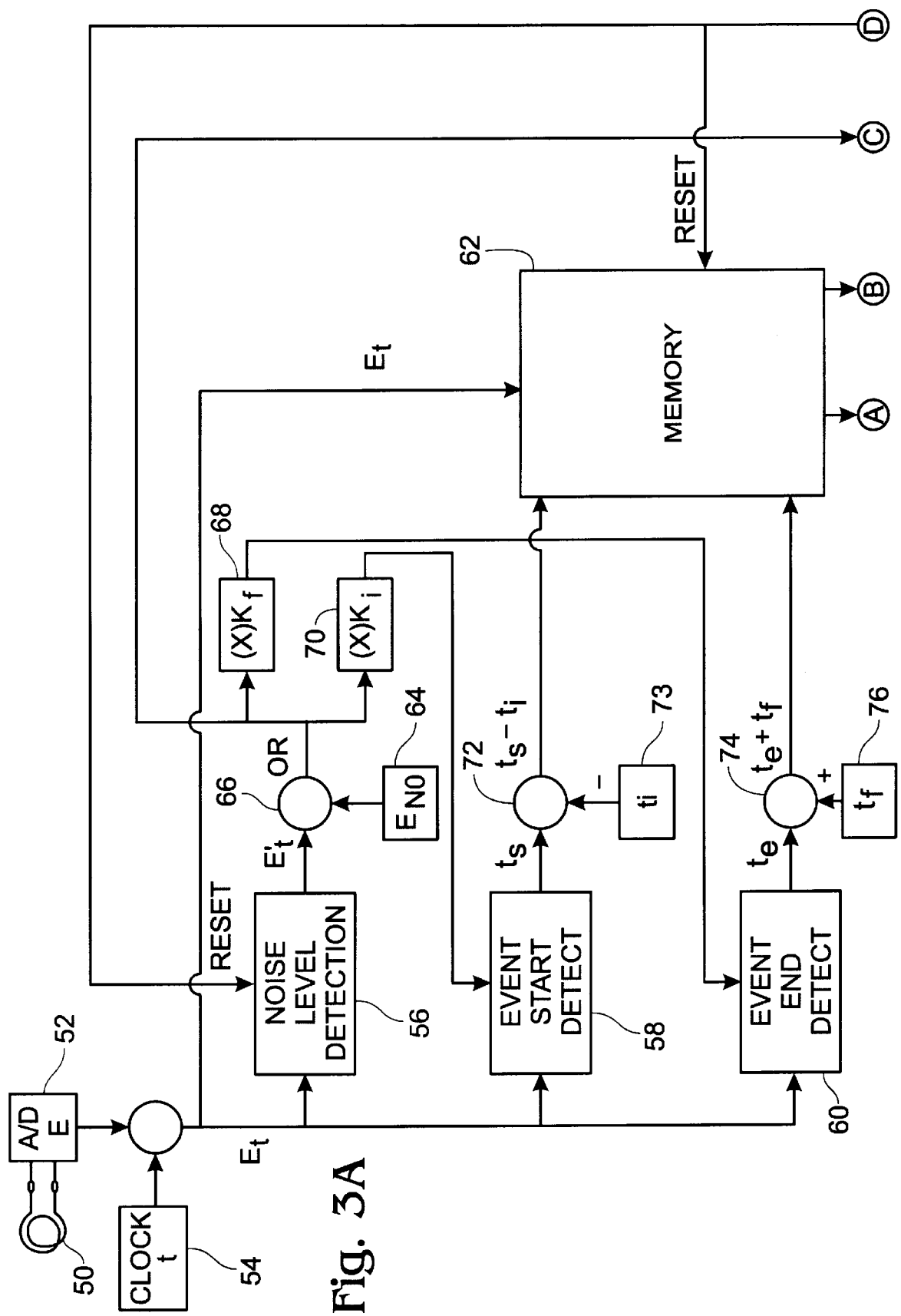
FIG. 3A is a first portion of a schematic flow-chart diagram of a magnetic flux detecting device employing microprocessor based architecture.
Figure 3B:
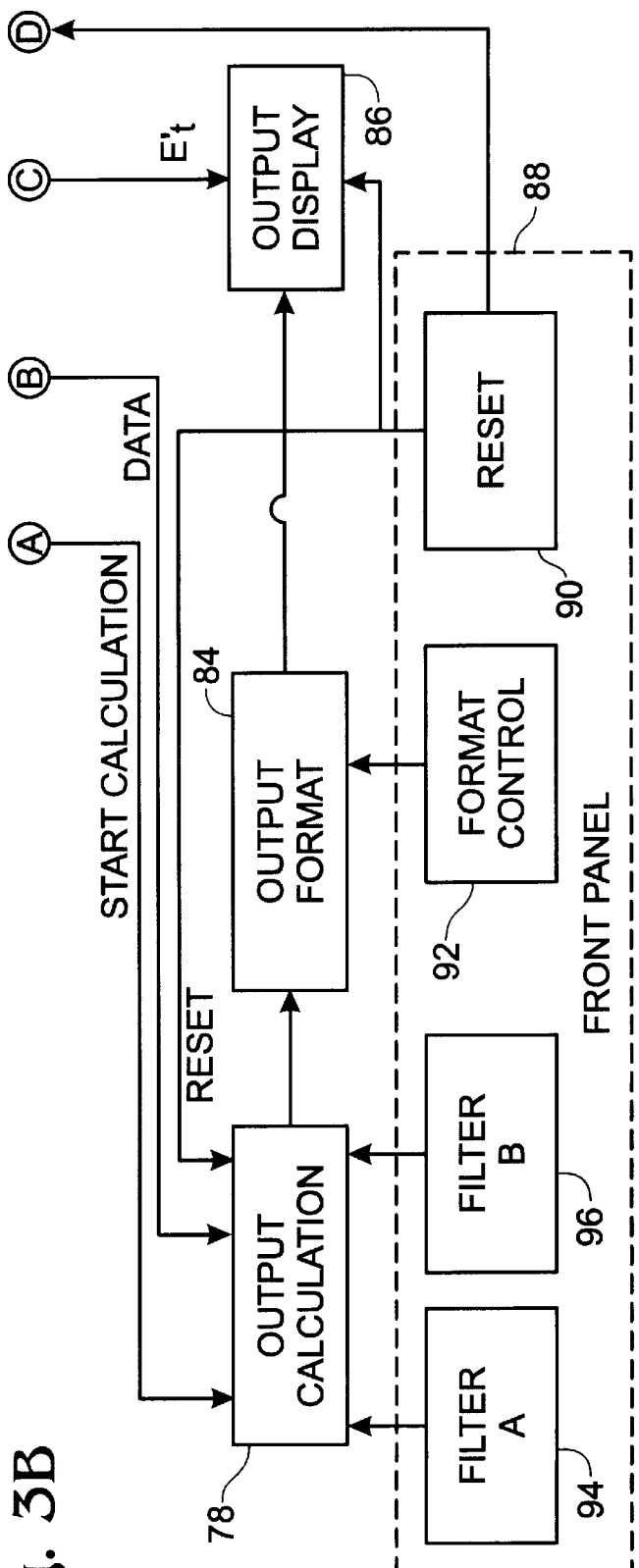
FIG. 3B is a second portion of the schematic flow-chart diagram referred to in the description of FIG. 3A.

Referring to FIGS. 3A and 3B (collectively referred to hereinafter as FIG. 3) a preferred embodiment of the invention shows a digital fluxmeter employing microprocessor-based architecture. FIG. 3 shows, in schematic form, a functional flow-chart of the operation of the microprocessor and associated memory.

A coil 50 for sensing magnetic flux is coupled to an A/D converter 52. The A/D converter 52 samples voltage in the coil 50 at a rate determined by a clock 54 to develop a digital signal $E_t$. The digital voltage samples $E_t$ are evaluated by a noise level detection function 56, event start detection function 58 and an event end detection function 60. Data is stored in a memory 62 which is a recirculating memory similar to recirculating memory 16 (refer to FIG. 1).

Figure 4:
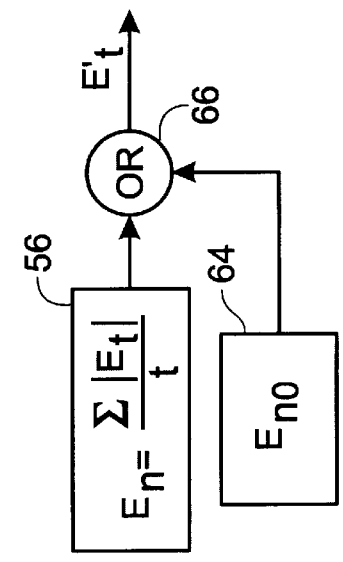
FIG. 4 is a schematic flow-chart diagram of the noise level detection function in the device of FIG. 3.

The noise level detection function 56 is shown in FIG. 4. The digital voltage samples $E_t$ have their absolute values summed and averaged over an interval t. This creates the value $E_n$. A nominal noise value, $E_{n0}$, is stored at block 64. The decision at node 66 selects either $E_n$ or $E_{n0}$ depending upon the time interval. If the time interval is less than $t_{ni}$ then a new value $E'_t$ is made equal to $E_{n0}$, otherwise $E'_t$ is made equal to $E_n$. This means that the value used for ambient noise is either a user selected value for a brief startup period or is the average over a predetermined time interval. The noise value $E'_t$ is multiplied at block 68 by a constant $K_f$ and is multiplied at block 70 by another constant $K_i$. Thus $E'_tK_i$ forms an input to the event start detect block 58 and $E'_tK_f$ is provided as an input to the event end detect block.

Figure 5:
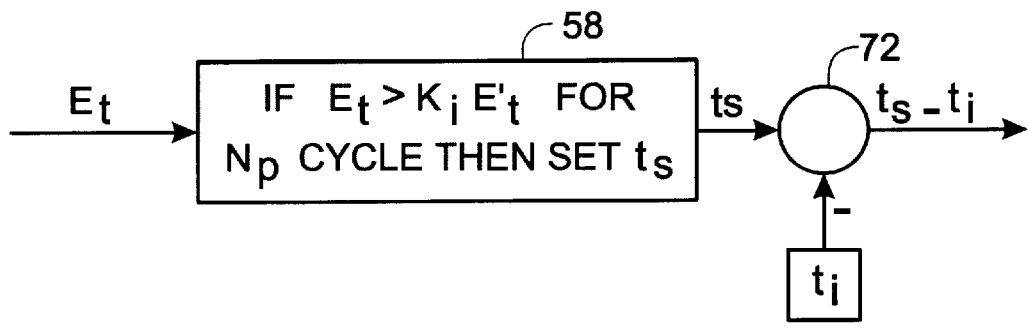
FIG. 5 is a schematic flow-chart diagram of the event start detection function of the device of FIG. 3.

The event start detect function 58 is shown in FIG. 5. To determine the start of an event the sampled digital voltage $E_t$ is compared with the noise level times a constant for a predetermined number of cycles. If the comparison is true a time $T_s$ is set. At node 72 a time constant $T_i$ is subtracted from $T_s$ and is stored in the memory 62. This marks a location in memory where event evaluation is to begin. This operation therefore captures all samples $E_t$ stored at addresses beginning at time $T_s-T_i$.

Figure 6:
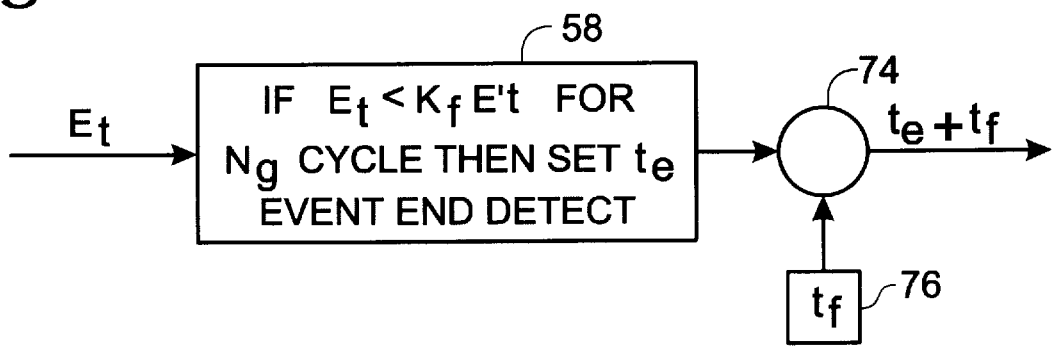
FIG. 6 is a schematic flow-chart diagram of the event end detection function of the device of FIG. 3.

The detection of the end of the event is calculated in much the same fashion as shown in FIG. 6. The event end detection function 60 compares the sampled digital voltage $E_t$ with a constant times the noise level for a predetermined number of cycles. If the condition is true, a time $T_e$ is set. A constant $T_f$ at block 76 is added to $T_e$ to designate the location in the memory 62 marking the end point of the values of $E_t$ which are of interest. The values of $E_t$ that occur between times $T_s-T_i$ and $T_e+T_f$ are then provided to the output calculation block 78.

Figure 2:
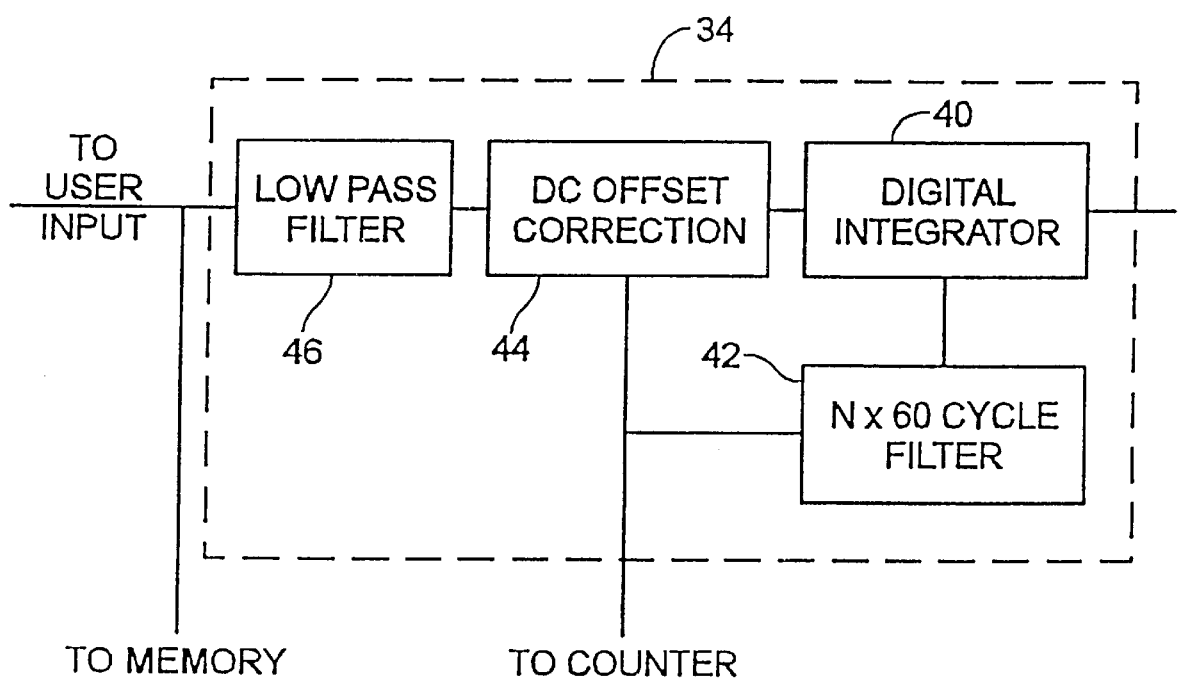
FIG. 2 is a block schematic diagram of the event analyzer of FIG. 1.
Figure 7:
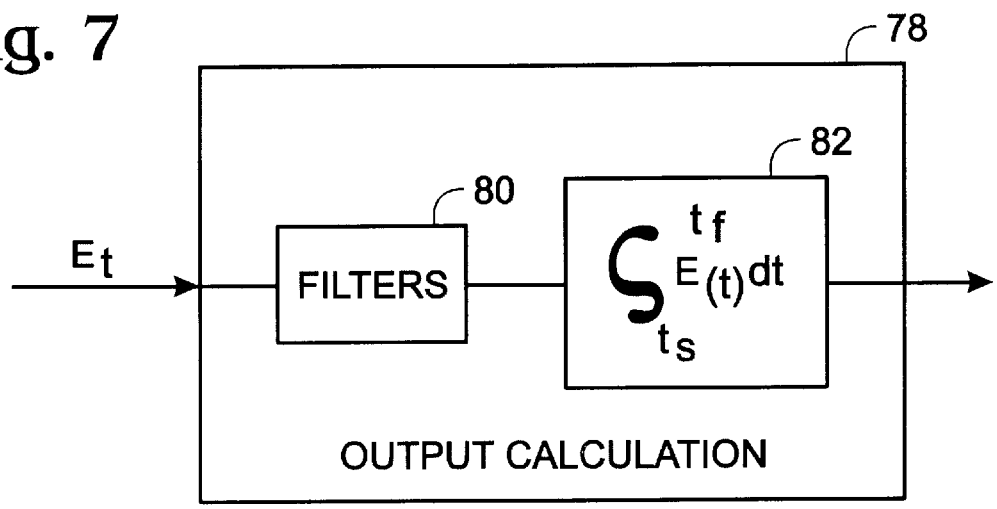
FIG. 7 is a schematic flow-chart diagram of the output calculation function of the device of FIG. 3.

The output calculation function is shown in FIG. 7. The data $E_t$ is first filtered by filters 80 and then integrated over time between $T_s$ and $T_f$ in integrator block 82. The output calculation 78 is provided to an output format block 84 which is in turn connected to an output display 86 which may be a digital display. A front panel 88 is provided wherein the user may enter commands such as reset 90, format control 92 as well as selective activation of filters such as filter A 94 or filter B 96. Filters A and B 94, 96 function like low pass filters 46 and 44 in FIG. 2. The other functions of the embodiment of FIG. 3 are otherwise in all respects similar to those described in connection with FIG. 1.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A magnetic flux measuring device, comprising:
    (a) a magnetic flux sensing coil of conductive material for producing a voltage in the presence of a magnetic field;
    (b) an analog to digital converter coupled to the output of the sensing coil for sampling the voltage produced by said magnetic flux sensing coil and for converting said voltage to digital data;
    (c) an event detector for comparing an ambient noise threshold with the output of said analog to digital converter and signaling the start of an event of measurable magnetic flux when said output rises above said noise threshold and the end of said event when said output falls below said noise threshold; and
    (d) a digital integrating device coupled to said analog to digital converter and said event detector for determining the total magnetic flux sensed by the coil by integrating the digital data over the time interval corresponding to said event.

2. The magnetic flux measuring device of claim 1, further including memory for storing said digital data.

3. The magnetic flux measuring device of claim 2, further including a counter responsive to said event detector and adapted for capturing said digital data in said memory present at a time prior to the beginning of said event time interval.

4. The magnetic flux measuring device of claim 3, wherein said counter includes a rate control for adjusting the sampling rate of said digital to analog converter based upon the amount of memory available in said memory.

5. The magnetic flux measuring device of claim 2, wherein said memory is responsive to said event detector and is adapted for storing said digital data from a time prior to said start of said event until a time corresponding to said end of said event.

6. The magnetic flux measuring device of claim 5, wherein said memory is a recirculating memory.

7. The magnetic flux measuring device of claim 2, further including an offset correction circuit coupled to said digital integrating device adapted for deriving an offset correction factor from an average noise amplitude determined over a predetermined time interval from a time prior to the beginning of said event time interval, wherein said offset correction circuit is adapted to apply said offset correction factor to the stored said digital data.

8. The magnetic flux measuring device of claim 1 further including a filter for removing periodic line noise.

9. The magnetic flux measuring device of claim 8, wherein said filter is adapted to set an integration time interval that is an integral multiple of the period of said periodic line noise.

10. The magnetic flux measuring device of claim 1, further including an offset correction circuit coupled to said digital integrating device adapted for deriving an offset correction factor from an average noise amplitude determined over a predetermined time interval from a time prior to the beginning of said event time interval.

11. The magnetic flux measuring device of claim 1, wherein said event detector is adapted to compare an output of said analog to digital converter with said noise threshold and determine the presence of said event as being when said output stays above said noise threshold for a predetermined period of time.

12. The magnetic flux measuring device of claim 1, wherein said integrating device includes a low pass filter for conditioning said digital data prior to integration to remove the effects of high frequency noise.

* * * * *